US011037784B2

(12) United States Patent
Qin et al.

(10) Patent No.: US 11,037,784 B2
(45) Date of Patent: Jun. 15, 2021

(54) AMORPHOUS CARBON LAYER OPENING PROCESS

(71) Applicant: Lam Research Corporation, Fremont, CA (US)

(72) Inventors: Ce Qin, Fremont, CA (US); Zhongkui Tan, Fremont, CA (US); Yisha Mao, Santa Clara, CA (US); Yansha Jin, Fremont, CA (US); Austin Casey Faucett, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/964,515

(22) PCT Filed: Jan. 28, 2019

(86) PCT No.: PCT/US2019/015443
§ 371 (c)(1),
(2) Date: Jul. 23, 2020

(87) PCT Pub. No.: WO2019/152322
PCT Pub. Date: Aug. 8, 2019

(65) Prior Publication Data
US 2021/0035796 A1  Feb. 4, 2021

Related U.S. Application Data

(60) Provisional application No. 62/626,264, filed on Feb. 5, 2018.

(51) Int. Cl.
*H01L 21/027* (2006.01)
*H01L 21/033* (2006.01)
(52) U.S. Cl.
CPC ...... *H01L 21/0271* (2013.01); *H01L 21/0332* (2013.01)

(58) Field of Classification Search
None
See application file for complete search history.

(56) References Cited

U.S. PATENT DOCUMENTS 5,021,121 A   6/1991  Groechel et al.
5,022,958 A   6/1991  Favreau et al.
(Continued)

FOREIGN PATENT DOCUMENTS

KR   2016-0027925   3/2016

OTHER PUBLICATIONS

International Search Report from International Application No. PCT/US2019/015443 dated May 15, 2019.
(Continued)

*Primary Examiner* — Roberts P Culbert
(74) *Attorney, Agent, or Firm* — Beyer Law Group LLP

(57) ABSTRACT

A method for opening an amorphous carbon layer mask below a hardmask is provided. The opening an amorphous carbon layer mask comprises performing one or more cycles, where each cycle comprises an amorphous carbon layer mask opening phase and a cleaning phase. The amorphous carbon layer mask opening phase comprises flowing an opening gas into a plasma processing chamber, wherein the opening gas comprises an oxygen containing component, creating a plasma from the opening gas, which etches features in the amorphous carbon layer mask, and stopping the flow of the opening gas. The cleaning phase comprises flowing a cleaning gas into the plasma processing chamber, wherein the cleaning gas comprises a hydrogen containing component, a carbon containing component, and a halogen containing component, creating a plasma from the cleaning gas; and stopping the flow of the cleaning gas into the plasma processing chamber.

17 Claims, 7 Drawing Sheets

(56) References Cited

U.S. PATENT DOCUMENTS

2007/0193973 A1* 8/2007 Kim .................. H01L 21/31116
       216/41
2010/0108264 A1 5/2010 Delgadino et al.
2010/0327413 A1 12/2010 Lee et al.

OTHER PUBLICATIONS

Written Opinion from International Application No. PCT/US2019/015443 dated May 15, 2019.

* cited by examiner

AMORPHOUS CARBON LAYER OPENING PROCESS

CROSS REFERENCE TO RELATED APPLICATION

This application claims the benefit of priority of U.S. Application No. 62/626,264, filed Feb. 5, 2018, which is incorporated herein by reference for all purposes.

BACKGROUND

The disclosure relates to a method of forming semiconductor devices on a semiconductor wafer. More specifically, the disclosure relates opening an amorphous carbon layer in the formation of semiconductor devices.

In forming semiconductor devices, holes are formed. In memory devices, high aspect memory holes may be formed. An amorphous carbon layer mask may be used as a mask for etching high aspect ratio memory holes.

SUMMARY

To achieve the foregoing and in accordance with the purpose of the present disclosure, a method for opening an amorphous carbon layer mask below a hardmask is provided. The opening of an amorphous carbon layer mask below a hardmask comprises performing one or more cycles in a plasma processing chamber, where each cycle comprises an amorphous carbon layer mask opening phase and a cleaning phase. The amorphous carbon layer mask opening phase, comprises flowing an opening gas into a plasma processing chamber, wherein the opening gas comprises an oxygen containing component, creating a plasma from the opening gas in the plasma processing chamber, wherein the plasma etches features in the amorphous carbon layer mask, and stopping the flow of the opening gas into the plasma processing chamber. The cleaning phase comprises flowing a cleaning gas into the plasma processing chamber, wherein the cleaning gas comprises a hydrogen containing component, a carbon containing component, and a halogen containing component, creating a plasma from the cleaning gas in the plasma processing chamber; and stopping the flow of the cleaning gas into the plasma processing chamber.

These and other features of the present disclosure will be described in more detail below in the detailed description of embodiments and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present embodiments will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
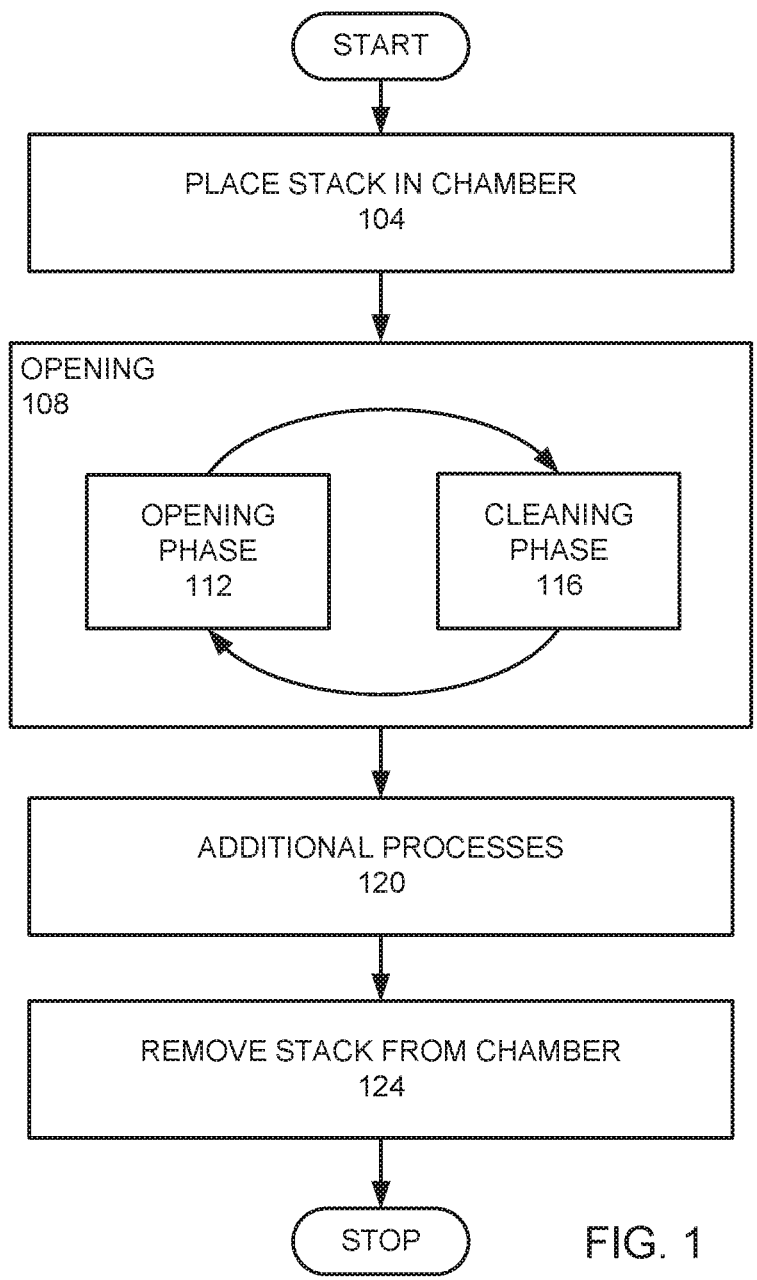
FIG. 1 is a high level flow chart of an embodiment.

FIG. 1 is a high level flow chart of an embodiment. In this embodiment, a stack with an amorphous carbon layer mask is placed in a plasma processing chamber (step 104). Amorphous carbon is a noncrystalline carbon material. The amorphous carbon layer mask is opened with the mask (step 108), comprising a single step opening process, or one cycle of an opening phase and a cleaning phase, or a plurality of cycles of an opening phase (step 112) and a cleaning phase (step 116). Additional process steps may be provided (step 120). A memory hole is formed and the stack is removed from the plasma processing chamber (step 124).

EXAMPLE

Figure 2:
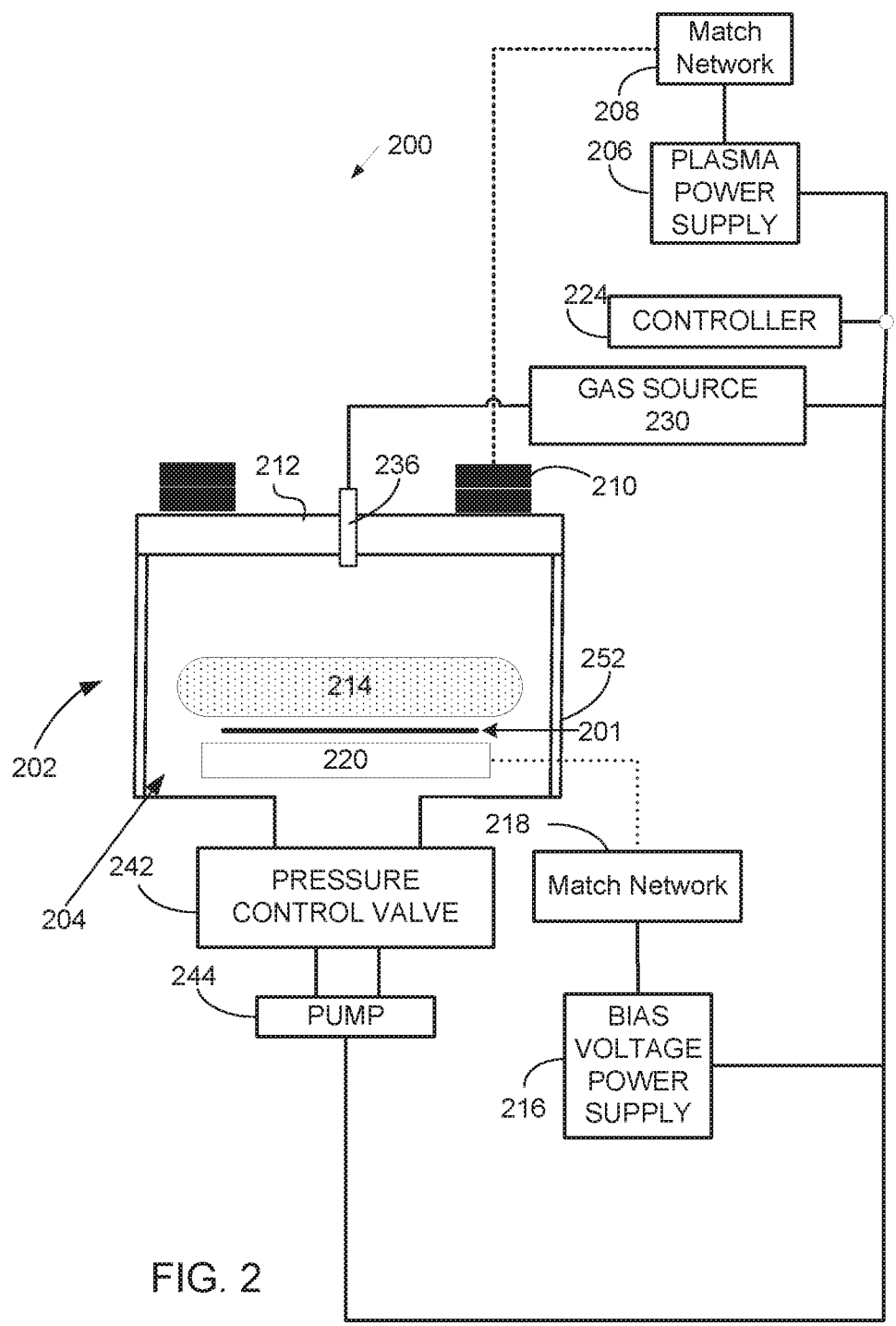
FIG. 2 is a schematic view of an etch chamber that may be used in an embodiment.

FIG. 2 schematically illustrates an example of a plasma processing system 200 which may be used to process a stack 201 in accordance with one embodiment. The plasma processing system 200 includes a plasma reactor 202 having a plasma processing chamber 204, enclosed by a chamber wall 252. A plasma power supply 206, tuned by a match network 208, supplies power to a transformer coupled power (TCP) coil 210 located near a power window 212 to create a plasma 214 in the plasma processing chamber 204 by providing an inductively coupled power. The TCP coil (upper power source) 210 may be configured to produce a uniform diffusion profile within the plasma processing chamber 204. For example, the TCP coil 210 may be configured to generate a toroidal power distribution in the plasma 214. The power window 212 is provided to separate the TCP coil 210 from the plasma processing chamber 204 while allowing energy to pass from the TCP coil 210 to the plasma processing chamber 204. A wafer bias voltage power supply 216 tuned by a match network 218 provides power to an electrode 220 to set the bias voltage on the stack 201 which is supported over the electrode 220. A controller 224 sets points for the plasma power supply 206 and the wafer bias voltage power supply 216.

The plasma power supply 206 and the wafer bias voltage power supply 216 may be configured to operate at specific radio frequencies such as, 13.56 megahertz (MHz), 27 MHz, 2 MHz, 1 MHz, 400 kilohertz (kHz), or combinations thereof. Plasma power supply 206 and wafer bias voltage power supply 216 may be appropriately sized to supply a range of powers in order to achieve desired process performance. For example, in one embodiment, the plasma power supply 206 may supply the power in a range of 50 to 5000 watts, and the wafer bias voltage power supply 216 may supply a bias voltage of in a range of 0 to 3000 volts (V). In addition, the TCP coil 210 and/or the electrode 220 may be comprised of two or more sub-coils or sub-electrodes, which may be powered by a single power supply or powered by multiple power supplies.

As shown in FIG. 2, the plasma processing system 200 further includes a gas source/gas supply mechanism 230. The gas source/gas supply mechanism 230 provides gas to a gas feed 236 in the form of a nozzle. The process gases and byproducts are removed from the plasma processing chamber 204 via a pressure control valve 242 and a pump 244. The pressure control valve 242 and pump 244 may also serve to maintain a particular pressure within the plasma processing chamber 204. The gas source/gas supply mechanism 230 is controlled by the controller 224. A Kiyo by Lam Research Corp. of Fremont, Calif., may be used to practice an embodiment.

Figure 3:
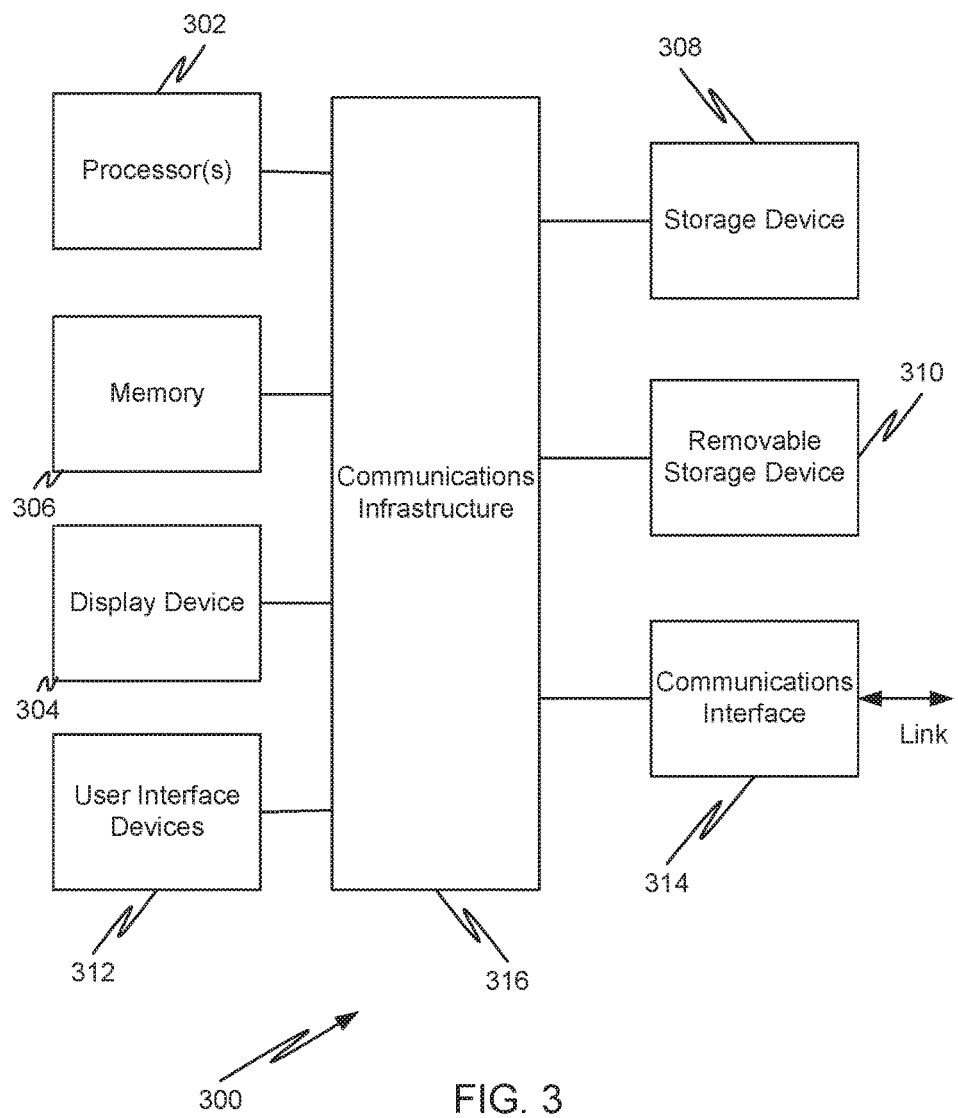
FIG. 3 is a schematic view of a computer system that may be used in practicing an embodiment.

FIG. 3 is a high level block diagram showing a computer system 300, which is suitable for implementing a controller 224 used in embodiments. The computer system may have many physical forms, ranging from an integrated circuit, a printed circuit board, and a small handheld device, up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communications interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory, and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
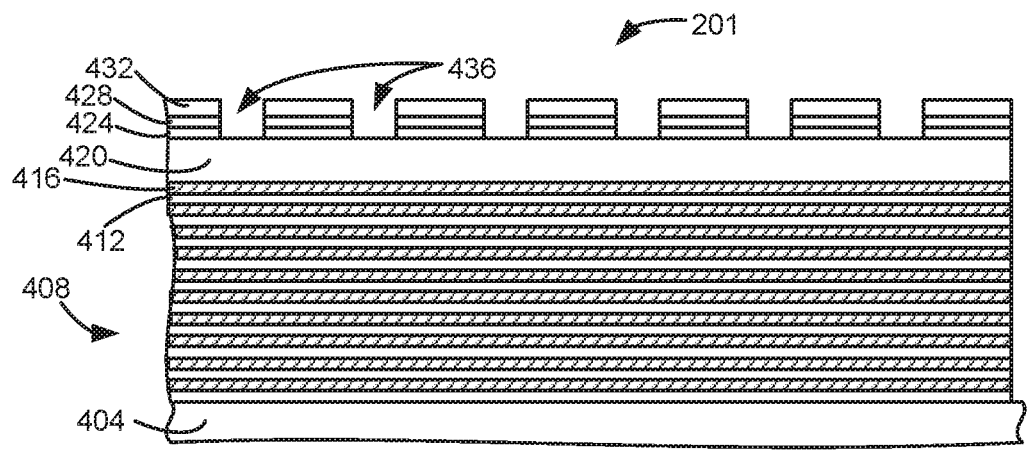
FIGS. 4A-D are schematic cross-sectional views of a stack processed according to an embodiment.

In an embodiment, a stack comprises an ONON (silicon oxide ($SiO_2$), silicon nitride (SiN), silicon oxide, silicon nitride and repeating) stack with a multilayer mask. FIG. 4A is a schematic cross-sectional view of a stack 201 comprising a substrate 404 under a memory stack 408, comprising a plurality of bilayers of a layer of silicon oxide ($SiO_2$) 416 on top of a layer of silicon nitride 412. A multilayer mask is over the memory stack 408. In this embodiment, the multilayer mask comprises an amorphous carbon layer (ACL) mask 420 under a dielectric anti-reflective coating (DARC) 424, under a bottom anti-reflective coating (BARC) 428, under a patterned photoresist mask 432. In this embodiment, lithographic processes are used to pattern the patterned photoresist mask 432 to provide mask features 436. An opening process is used to pattern the BARC 428 and DARC 424, using the patterned photoresist mask 432. Such processes may remove the patterned photoresist mask 432. In this embodiment, the DARC 424 is silicon oxynitride (SiON). The DARC 424 is used as a hardmask to open the ACL mask 420.

Figure 5A:
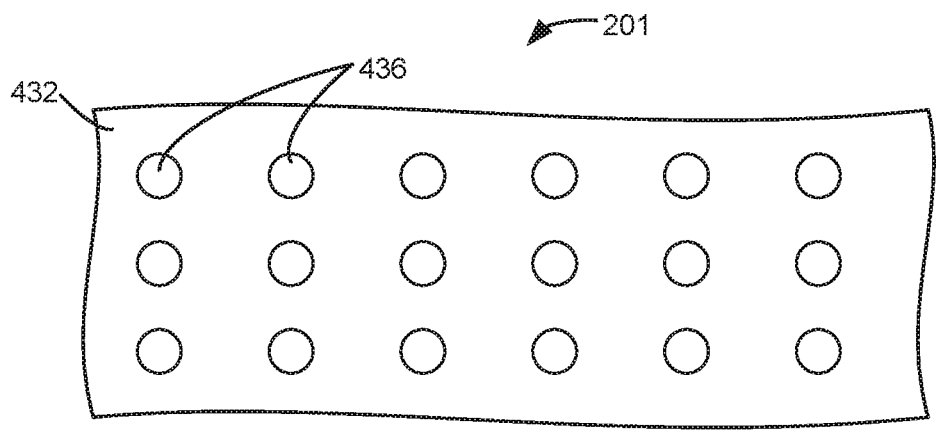
FIG. 5A is a top view of part of a stack.

FIG. 5A is a top view of part of the stack 201, showing the top of the patterned photoresist mask 432 and the mask features 436. The mask features 436 are cylindrical holes with a circular cross section, as shown.

The stack 201 is placed in the plasma processing chamber 204, as shown in FIG. 2. After the stack 201 has been placed into the plasma processing chamber 204, the amorphous carbon layer mask is opened (step 108). The amorphous carbon layer mask opening (step 108), comprising a single step opening process, or one cycle of an opening phase and a cleaning phase, or a plurality of cycles of an opening phase (step 112) and a cleaning phase (step 116). The stack 201 is maintained at a temperature of at least 20° C. in this embodiment.

Figure 6:
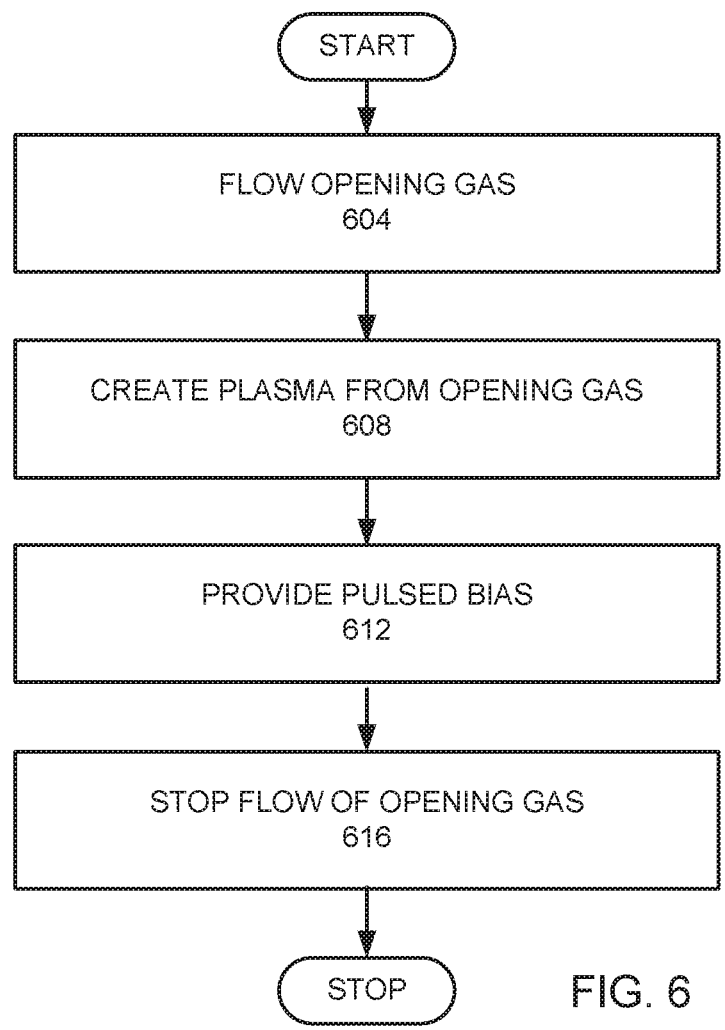
FIG. 6 is a more detailed flow chart of the opening phase.

FIG. 6 is a more detailed flow chart of the opening phase (step 112). An opening gas is flowed into the plasma processing chamber 204 (step 604), where the opening gas comprises an oxygen containing component. In this embodiment, the opening gas consists essentially of from about 100 standard cubic centimeters per minute (sccm) to about 3000 sccm oxygen ($O_2$) and from about 10 sccm to about 500 sccm carbonyl sulfide (COS), and/or 10 sccm to about 500 sccm $SO_2$. In addition, methane ($CH_4$), fluoromethane ($CH_3F$), difluoromethane ($CH_2F_2$), hydrogen bromide (HBr), chlorine ($Cl_2$), silicon tetrachloride ($SiCl_4$), silicon tetra fluoride ($SiF_4$), nitrogen ($N_2$), helium (He), or argon (Ar) could be added to achieve good etch performance. A plasma is created from the opening gas in the plasma processing chamber 204 (step 608). The plasma etches features in the ACL mask 420. In this example, the plasma is created by providing between about 300 watts and about 6000 watts of radio frequency (RF) power at about 13.56 MHz through the TCP coil 210 to the plasma processing chamber 204. A pulsed bias with an amplitude of 100 volts to 3000 volts is provided (step 612) to the stack 201 through the electrode 220 from the wafer bias voltage power supply 216. In this embodiment, the bias has an RF frequency of 13.56 MHz, 27 MHz, 2 MHz, 1 MHz, or 400 kHz, either in continuous wave, or with a pulse frequency of between about 1 hertz (Hz) and about 10000 Hz and a duty cycle between about 3% and about 99%. After about 5 seconds to about 600 seconds the flow of the opening gas into the plasma processing chamber is stopped (step 616).

Figure 4B:
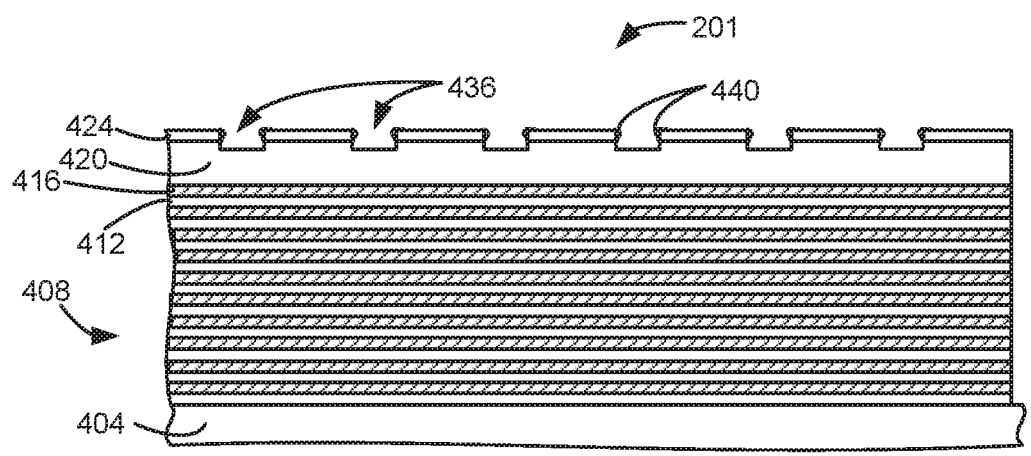

FIG. 4B is a schematic cross-sectional view of a stack 201, after an opening phase (step 112) is completed. The mask features 436 have been partially etched into the ACL mask 420. The BARC 428 and patterned photoresist mask 432 (not shown in FIG. 4B) have been removed, thus exposing the DARC 424 to the plasma. The plasma sputters some of the DARC 424. The sputtered DARC 424 is redeposited and forms a silicon containing redeposited hardmask 440. The redeposited hardmask 440 may change the CD and the circular cross-section of the mask features 436.

Figure 7:
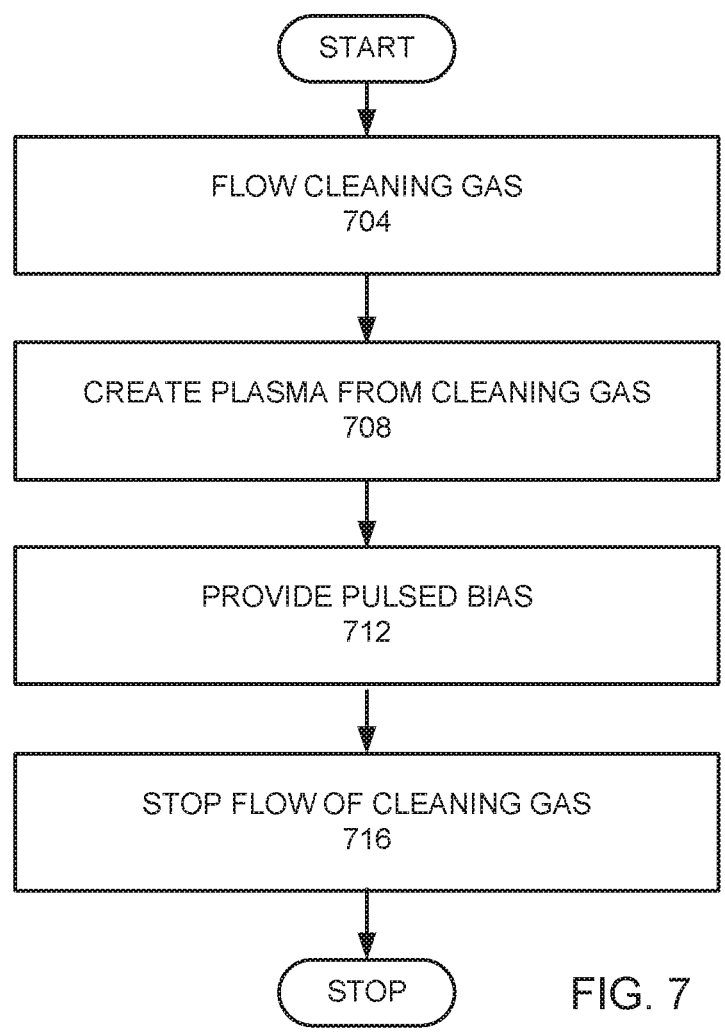
FIG. 7 is a more detailed flow chart of the cleaning phase.

FIG. 7 is a more detailed flow chart of the cleaning phase (step 116). A cleaning gas is flowed into the plasma processing chamber 204 (step 704), where the cleaning gas comprises a hydrogen containing component, a carbon containing component, and a halogen containing component. In this embodiment, the cleaning gas consists essentially of from about 10 sccm to about 1000 sccm fluoromethane ($CH_3F$). Other gases can be added, including $CH_2F_2$, fluoroform ($CHF_3$), carbon tetrafluoride ($CF_4$), $CH_4$, nitrogen trifluoride ($NF_3$), sulfur hexafluoride ($SF_6$), $N_2$, Ar, He, $SiCl_4$, $Cl_2$, HBr, or $SiF_4$; or as a substitution, including $CH_2F_2$, $CHF_3$, and CH4. A plasma is created from the cleaning gas in the plasma processing chamber (step 708). The plasma removes redeposited hardmask and deposits a carbon based passivation layer on top and sidewalls of the mask features 436. In this example, the plasma is formed by providing between about 100 watts and about 6000 watts of RF power at about 13.56 MHz through the TCP coil 210 to the plasma processing chamber 204. A bias with an amplitude of greater than about 500 volts is provided (step 712) to the stack 201 through the electrode 220 from the wafer bias voltage power supply 216. In this embodiment, the bias has an RF frequency of about 13.56 MHz, 27 MHz, 2 MHz, 1 MHz, or 400 kHz with a continuous wave or a pulse frequency of between about 1 Hz and about 10000 Hz and a duty cycle between about 3% and about 99%. After about 3 seconds to about 100 seconds, the flow of the cleaning gas into the plasma processing chamber is stopped (step 716).

Figure 4C:
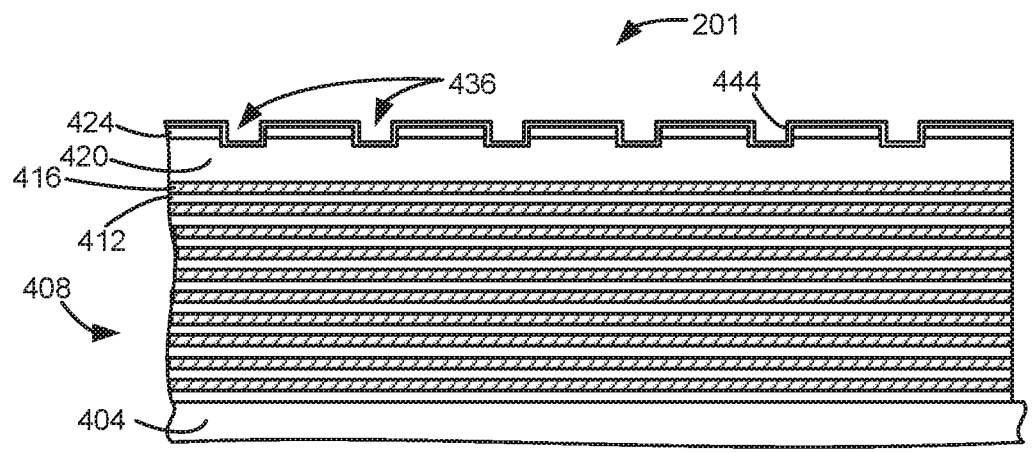

FIG. 4C is a schematic cross-sectional view of a stack 201, after a cleaning phase (step 116) is completed. The cleaning phase (step 116) removes the redeposited hardmask 440 (not shown in FIG. 4C). The halogen containing component of $CH_3F$ provides a halogen. The halogen is used to etch away the redeposited hardmask. $CH_3F$ has a carbon containing component and a hydrogen containing component. The carbon containing component and hydrogen containing component are used to form a carbon containing sidewall passivation 444 on sidewalls of the mask features 436.

Figure 4D:
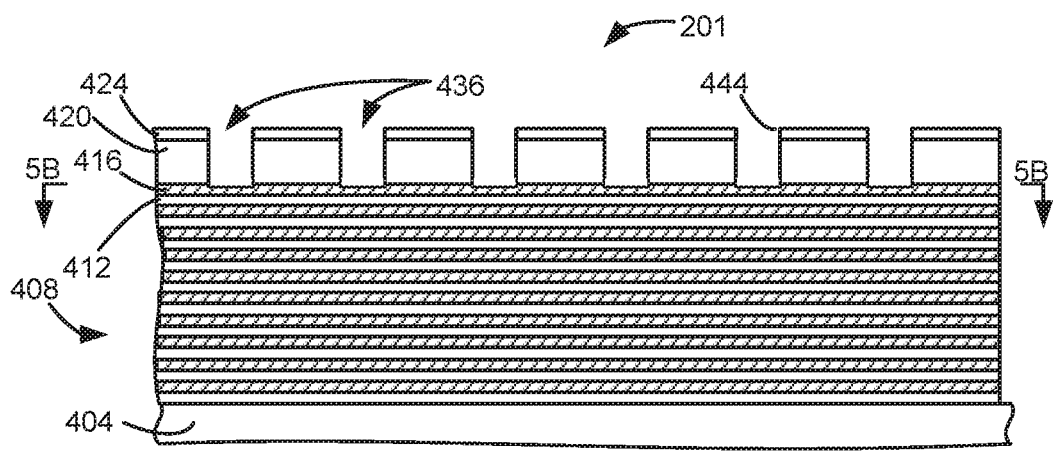
Figure 5B:
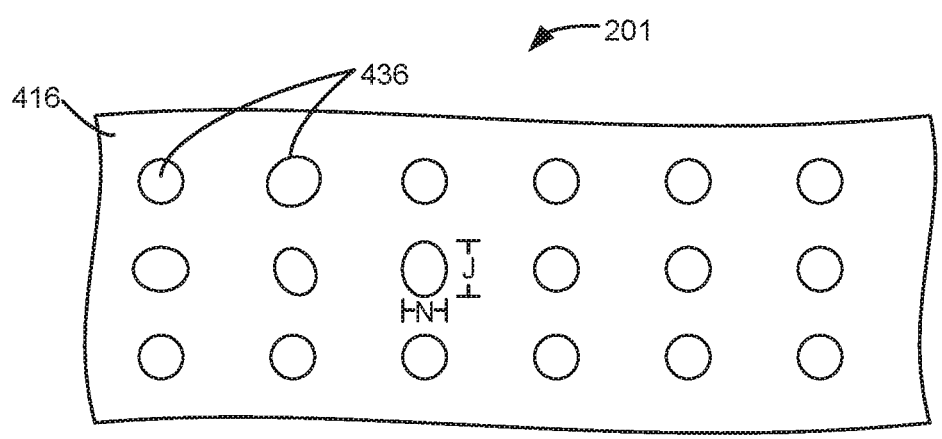
FIG. 5B is a cross-sectional view of a stack

The opening (step 108) comprising a plurality of cycles of an opening phase (step 112) and a cleaning phase (step 116) is continued until the ACL mask 420 opening is completed. FIG. 4D is a schematic cross-sectional view of a stack 201, after ACL mask 420 opening (step 108) is completed. In this embodiment, to check the bottom shape of memory holes after carbon hole is formed, the layer of $SiO_2$ 416 under the ACL mask 420 can be slightly etched by the opening (step 108) forming a dimple in the layer of $SiO_2$ 416. FIG. 5B a cross-sectional view of the stack 201 along cut lines 5B-5B after the ACL mask 420 opening (step 108) is completed. Some of the cross-sections of the mask features 436 are elliptical instead of circular. Some of the cross-sections of the mask features have a larger CD and some of the cross-sections of the mask features have a smaller CD. In various embodiments, the opening of the ACL mask may be a flashing or breakthrough process.

Additional processes may be performed on the stack 201 (step 120). For example, the plasma processing chamber 204 may be used to etch the memory stack 408. The stack 201 is removed from the plasma processing chamber 204 (step 124). Additional processing may be performed after the stack 201 is removed from the plasma processing chamber 204.

By maintaining the stack at a temperature of at least 20° C., more circular cross-sections are obtained. In other embodiments, the stack 201 is maintained at a temperature of at least 25° C. In addition, by providing a cleaning phase, redeposited hardmask is removed. The removal of the redeposited hardmask decreases CD variance from feature to feature. Otherwise CD variance and changing the dimensions and shapes of the features would be caused by redeposited hardmask forming on sidewalls of the features. The sidewall passivation 444 reduces bowing of the mask features 436. Various parameters are tuned in order to decrease CD variance from feature to feature, maintain cross-sectional circularity, minimize bowing, and maintaining a vertical etch profile. This embodiment provides the parameters of wafer temperature, to maintain circularity, cleaning gas chemistry to reduce bowing, a high cleaning bias to remove redeposited hardmask, and duty cycle as additional tuning knobs in order to provide a recipe that minimizes CD variance, variation from circularity, and bowing. The minimization of CD variance, variation from circularity, and bowing reduces defects and allows contacts to be placed closer together. The period of each phase provides another tuning knob.

A prior art process provided a cleaning phase with a cleaning gas of $CF_4$, $NF_3$, $SF_6$. For example, a $CF_4$ cleaning gas required a lower bias to remove redeposited hardmask, but also required a lower temperature. Such a process had allowed for a single parameter of $CF_4$ flow rate in order to control various characteristics. A recipe optimized for circularity would not be optimized for bowing, hole to hole variance and hole bottom circularity.

Circularity is measured by a circularity ratio of a minor axis of a feature divided by the major axis of the feature, or sometimes vice versa. The major axis would be the widest dimension of a feature and the minor axis would be the narrowest dimension of the feature. In FIG. 5B, for one of the mask features 436 the major axis is show as dimension J and the minor axis is shown as dimension N. In an experiment, it was found that the circularity ratio was improved (closer to 1.0, which is a perfect circle) over a prior art method, without increasing the feature to feature CD variance or increasing bowing. The resulting mask would improve defect performance when the resulting ACL mask 420 is used to etch features in the memory stack 408.

In an embodiment, the CD of the mask features 436 is less than about 300 nanometers (nm) and the thickness of the ACL mask 420 is at least 600 nm, so that the mask features have a height to width aspect ratio of at least about 2:1. In some embodiments, the bias during the cleaning phase has an amplitude of at least 500 volts. More preferably, the bias during the cleaning phase has an amplitude of at least about 1000 volts. More preferably, the bias during the cleaning phase has an amplitude of between about 1200 volts and about 3000 volts. Preferably, the bias during the opening phase has an amplitude of less than 3000 volts. More preferably, the bias during the opening phase has an amplitude no more than about 1500 volts. In other embodiments, different mixtures and ratios of hydrofluorocarbon may be used to further tune the process to improve circularity, while minimizing feature to feature variance and bowing. In an embodiment, another halogen may be used instead of fluorine. However, fluorine has been found to work in an embodiment. Preferably, the cleaning gas consists essentially of at least one or more of $CHF_3$, $CH_2F_2$, and $CH_3F$.

Without being bound by theory, it is believed that during the cleaning phase with a high bias, the redeposited hardmask is removed and at the same time, or during the part of the duty cycle where there is no bias the sidewall passivation and/or a carbon based deposition on top are deposited without removing redeposited hardmask. The formation of the sidewall passivation reduces bowing. In some embodiments, the hardmask is of a silicon containing material. Preferably, the hardmask is at least one of silicon oxynitride (SiON), $SiO_2$, SiN, silicon (Si), metal, doped carbon, or doped Si, where the redeposited hardmask comprises silicon or metal. In various embodiments, the opening gas is halogen free, since a halogen is not needed for etching the ACL mask 420 and the cleaning gas is oxygen free, since the presence of oxygen would reduce the deposition of the sidewall passivation 444.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for opening an amorphous carbon layer mask below a hardmask, comprising performing one or more cycles in a plasma processing chamber, wherein each cycle comprises:
    an amorphous carbon layer mask opening phase, comprising;
        flowing an opening gas into a plasma processing chamber, wherein the opening gas comprises an oxygen containing component;
        creating a plasma from the opening gas in the plasma processing chamber, wherein the plasma etches features in the amorphous carbon layer mask; and
        stopping the flow of the opening gas into the plasma processing chamber; and
    a cleaning phase, comprising:
        flowing a cleaning gas into the plasma processing chamber, wherein the cleaning gas comprises a hydrogen containing component, a carbon containing component, and a halogen containing component;
        creating a plasma from the cleaning gas in the plasma processing chamber; and
        stopping the flow of the cleaning gas into the plasma processing chamber.

2. The method, as recited in claim 1, wherein the hydrogen containing component, the carbon containing component, and the halogen containing component consist essentially of at least one hydrofluorocarbon.

3. The method, as recited in claim 2, wherein the at least one hydrofluorocarbon is one or more of $CHF_3$, $CH_2F_2$, and $CH_3F$.

4. The method, as recited in claim 1, wherein the amorphous carbon layer mask opening phase forms redeposited hardmask on the features in the amorphous carbon layer mask and wherein the cleaning phase removes the redeposited hardmask and deposits a carbon containing layer on sidewalls of the features in the amorphous carbon layer mask.

5. The method, as recited in claim 4, wherein the hardmask comprises silicon or metal, wherein the redeposited hardmask comprises silicon or metal.

6. The method, as recited in claim 4, wherein the hardmask comprises at least one of SiON, $SiO_2$, SiN, Si, metal, doped carbon, or doped Si, wherein the redeposited hardmask comprises silicon or metal.

7. The method, as recited in claim 1, wherein the cleaning phase further comprises providing a bias with an amplitude of greater than 500 volts.

8. The method, as recited in claim 7, wherein the bias is pulsed and has a duty cycle between about 3% to about 99%.

9. The method, as recited in claim 7, wherein the amorphous carbon layer mask opening phase further comprises providing a pulsed bias with an amplitude of less than 1500 volts.

10. The method, as recited in claim 1, further comprising maintaining the amorphous carbon layer mask at a temperature of at least 20° C. during the amorphous carbon layer mask opening phase and during the cleaning phase.

11. The method, as recited in claim 1, wherein the opening gas comprises oxygen and COS, or $SO_2$.

12. The method, as recited in claim 1, wherein the cleaning phase further comprises providing a pulsed bias with an amplitude of greater than 1000 volts.

13. The method, as recited in claim 12, wherein the pulsed bias has a duty cycle between about 20% to about 80%.

14. The method, as recited in claim 12, wherein the amorphous carbon layer mask opening phase further comprises providing a pulsed bias with an amplitude of less than 1000 volts.

15. The method, as recited in claim 1, further comprising maintaining the amorphous carbon layer mask at a temperature of at least 25° C. during the amorphous carbon layer mask opening phase and during the cleaning phase.

16. The method, as recited in claim 1, wherein the opening gas is halogen free and wherein the cleaning gas is oxygen free.

17. The method, as recited in claim 1, wherein the opening the amorphous carbon layer mask opens features with a CD of less than about 300 nm.

* * * * *